(12) United States Patent
Kontturi et al.

(10) Patent No.: US 9,852,236 B2
(45) Date of Patent: Dec. 26, 2017

(54) COMPUTER-AIDED MODELING

(71) Applicant: Tekla Corporation, Espoo (FI)

(72) Inventors: Elja Kontturi, Espoo (FI); Jukka Suomi, Espoo (FI); Teemu Heikkonen, Vantaa (FI); Ragnar Wessman, Espoo (FI)

(73) Assignee: Tekla Corporation, Espoo (FI)

( * ) Notice: Subject to any disclaimer, the term of this patent is extended or adjusted under 35 U.S.C. 154(b) by 371 days.

(21) Appl. No.: 14/743,621

(22) Filed: Jun. 18, 2015

(65) Prior Publication Data

US 2015/0370924 A1 Dec. 24, 2015

(30) Foreign Application Priority Data

Jun. 19, 2014 (FI) ..................................... 20145599

(51) Int. Cl.
*G06F 17/50* (2006.01)
*A63H 33/04* (2006.01)

(52) U.S. Cl.
CPC ............. *G06F 17/50* (2013.01); *A63H 33/04* (2013.01)

(58) Field of Classification Search
USPC ................. 703/2, 22, 24, 6; 463/42; 235/454
See application file for complete search history.

(56) References Cited

U.S. PATENT DOCUMENTS

| | | | |
|---|---|---|---|
| 7,856,342 B1 | 12/2010 | Kfouri et al. | |
| 9,206,309 B2 * | 12/2015 | Appleby | ................... B22C 9/04 |
| 2006/0086794 A1 * | 4/2006 | Knowles | ................ G02B 26/10 |
| | | | 235/454 |
| 2013/0328872 A1 | 12/2013 | Suomi et al. | |
| 2014/0342834 A1 * | 11/2014 | Tappeiner | .............. A63H 30/04 |
| | | | 463/42 |
| 2015/0375129 A1 * | 12/2015 | Tappeiner | .............. A63H 30/04 |
| | | | 446/454 |

OTHER PUBLICATIONS

Lauppe, J. "Reinforcement Toolbox: A Parametric Reinforcement Modelling Tool for Curved Surface Structures" Delft University of Technology Master's Thesis [online], Jan. 19, 2012 [Retrieved on Jan. 30, 2015]. Retrieved from the Internet: <URL: http://repository.tudelft.nl/view/ir/uuid%3Ab41a1e0f-d885-4bea-910f-0b80e8020f74/> summary; pp. 50, 57-59, 95-106.

"AutoCAD Structural Detailing: Surface distribution—bars" Autodesk Knowledge Network [online database], Apr. 10, 2014 [Retrieved on Feb. 6, 2015]. Retrieved from the Internet: <URL: http://knowledge.autodesk.com/support/autocad-structural-detailing/learn-explore/caas/CloudHelp/cloudhelp/2015/ENU/ASD-Reinforcement/_files/GUID-73022C17-23A0-4E7E-9767-45A3618674D0-htm.html> 7 pages.

* cited by examiner

*Primary Examiner* — Thai Phan
(74) *Attorney, Agent, or Firm* — Kilpatrick Townsend and Stockton

(57) ABSTRACT

A modeling application is provided with at least one repetition object type for creating at least one repetition instance of at least one repetitive article in a model, wherein the repetition object type is provided to be used for creating one or more repetition objects, a repetition object comprising at least one finite geometry definition surface definition that defines a geometry definition surface and its location in the model, and guide information. One or more repetition instances of a repetitive article are determined using of the at least one geometry definition surface and the guide information.

20 Claims, 8 Drawing Sheets

COMPUTER-AIDED MODELING

RELATED APPLICATIONS

This application claims priority to Finnish Patent Application No. 20145599, filed on Jun. 19, 2014, the contents of which is hereby incorporated herein by reference in their entirety.

FIELD

The invention relates to computer-aided modeling and, particularly, modeling one or more repetitive articles.

BACKGROUND

Modeling means that a model is created from an article/structure under design for describing the article/structure to be constructed, the model containing at least information needed to illustrate the article/structure. The development of data processing systems and computers has transformed modeling into a computerized process, where a product model is created from the article/structure. A wide variety of software applications, including computer-aided design applications and three-dimensional modeling applications, are currently available to end-users to prepare or edit a model, and/or to obtain necessary information from the model. For example, in building industry, a model of a building may be edited and/or used in several phases for different purposes by different persons: on a planning phase to combine plans from different designers (architects, structural engineers, designers for planning of heating plumbing ventilation and sanitation), who can see what the others have planned, and take that into account in their own design work; on a construction phase, a construction worker on a construction site will have exact plans and drawings, created from the information in the model, to facilitate and ensure that building elements/structural components will be placed on proper places and have proper size; on a maintenance phase the right information about the building, for example were plumbing pipes are and what is their size, is available to the maintenance team from the information in the model.

A building, and therefore also a model of building, comprise many building elements/structural components, such as columns, beams, slabs, walls, which in turn may comprise smaller structural components. For example, concrete structures, such as floor slabs and walls, incorporate into the model a very large number of physical reinforcement elements, such as steel bars ("rebars"). Typically each structural component is modeled as a fully modeled three-dimensional physical element. While this allows for accurate renderings in plan and section views and accurate amount information for manufacturing, it involves storing redundant information thereby increasing the memory size required by a 3D model, and need for processing power.

SUMMARY

The invention relates to methods, a program product, an apparatus and a system which are characterized by what is stated in the independent claims. The preferred embodiments are disclosed in the dependent claims.

A general aspect provides a repetition object for modeling one or more repetitive articles by corresponding one or more repetition instances, a repetition object comprising at least one finite surface definition that defines a geometry definition surface and its location in the model, and at least information with which one or more geometry guide surfaces or one or more geometry guide curves may be created, wherein a repetition instance of a repetitive article is determined based on an intersection of the at least one geometry definition surface and a geometry guide surface or a geometry guide curve that is created according to the information.

BRIEF DESCRIPTION OF THE DRAWINGS

In the following different embodiments of the invention will be described in greater detail with reference to the attached drawings, in which.

DETAILED DESCRIPTION OF SOME EMBODIMENTS

The following embodiments are exemplary. Although the specification may refer to "an", "one", or "some" embodiment(s) in several locations, this does not necessarily mean that each such reference is to the same embodiment(s)/example(s), or that the feature only applies to a single embodiment/example. Single features of different embodiments/examples may also be combined to provide other embodiments.

The present invention is applicable to any computer-aided modeling system. Various programming techniques, storage of data in memory and manners of implementing databases develop constantly. This may require extra changes in the invention. Consequently, all terms and expressions should be interpreted broadly, and they are intended to describe, not to restrict, the invention.

Figure 1A:
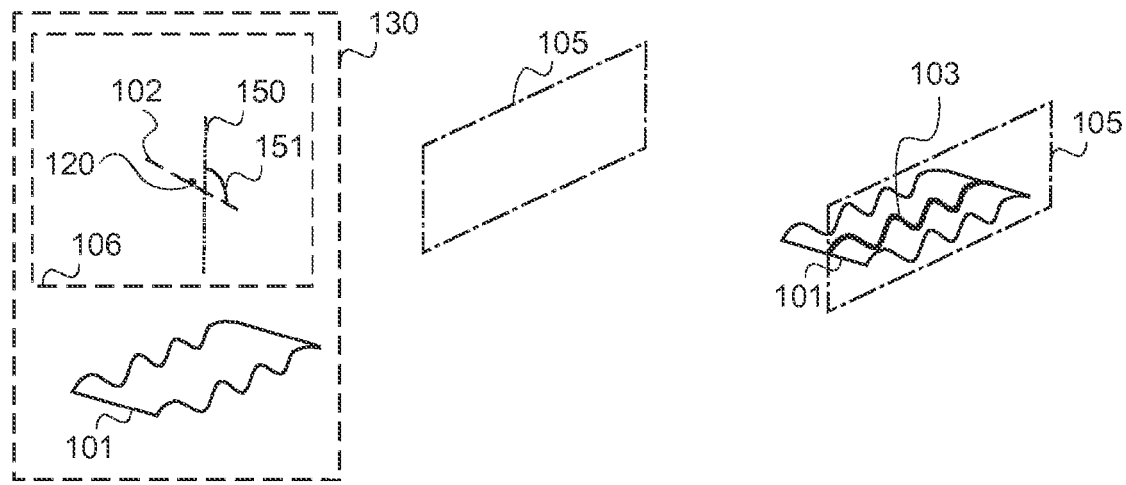
FIGS. 1A and 1B illustrate basic concepts.
Figure 1B:
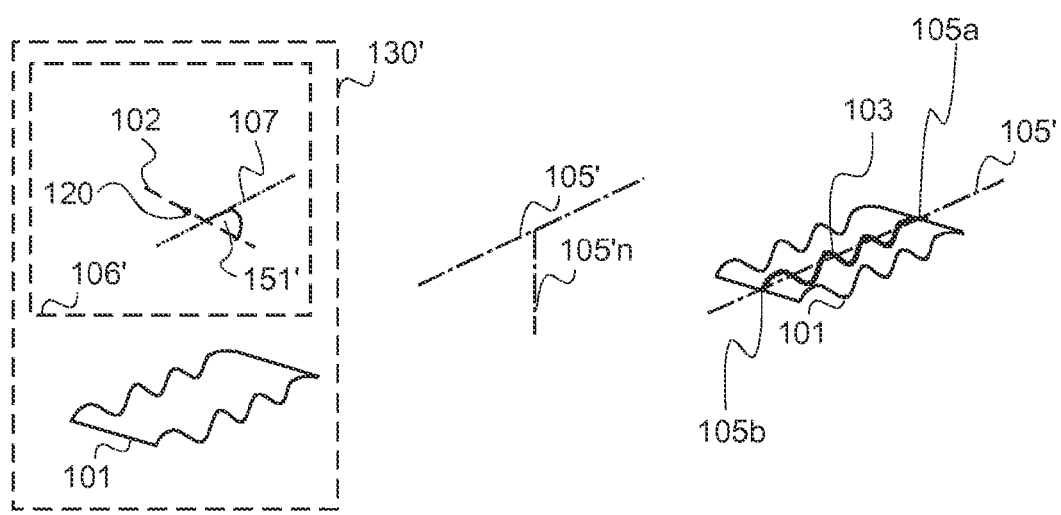

FIGS. 1A and 1B illustrate basic concepts for a repetition object in a simplified manner. A repetition object (RO) 130 is for creating one or more repetition instances (RIs) 103 to model a corresponding amount of real world articles in a model, as one unit, i.e. by one object with its definitions.

It should be appreciated that herein "article" means an item that will or may exist in the real world or at least is planned to exist in the real world. Further, it should be appreciated that the term "article" used herein means, in addition to one or more single pieces/items/elements, one or more parts, one or more assemblies including sub-assemblies, one or more structures, and one or more connections with their articles, like bolt(s), weld(s) or reinforcement splices(s).

Further, a repetitive article is an article (element) that is assumed or planned to occur more than once and in a repetitive manner. Examples of repetitive articles in a house building industry comprises reinforcement bars (rebars), beams, columns, slabs, molds, element walls, electric installations, heating, plumbing and/or ventilation engineering installations, gratings, stiffeners, purlings, reveals in concrete walls and/or projections. Examples of repetitive articles for railroad planning comprise fasteners and railroad ties (sleepers). Examples of repetitive articles in power supply systems comprise transformer substations, pylons and wires.

To model a repetitive article, a geometry definition surface (GDS) 101 has to be defined. The definitions of a GDS, called herein "GDS definition", define at least an exterior outline (boundary, contour) of one or more GDSs 101 and its/their location in the model. The one or more GDSs 101 define a surface or a combination of surfaces on which, either with or without an offset (situation in FIG. 1), the one or more RIs, or representations, or depictions, 103 of an RO will be created. A GDS may have an inward normal whose direction may be set separately, and the direction may be maintained regardless of changes made to the GDS. The inward normal may be used to define the direction of an offset, the offset being described in more detail below. It should be appreciated that the direction of the inward normal should not be dependent on the exterior outline of the GDS, and that the direction of the offset may be determined without using the direction of the inward normal.

In addition to the GDS, RO comprises additional means 106, 106' to model one or more RIs 103 of the RO.

In the exemplary embodiment illustrated in FIG. 1A, the additional means 106 define one or more geometry guide surfaces (GGSs). A GGS is for defining, with the GDS, an RI. The GGS may be an infinite surface, or at least extendable to intersect each GDS belonging to the same RO. The GGS may be called a guide plane, or a spacing plane.

Figure 8:
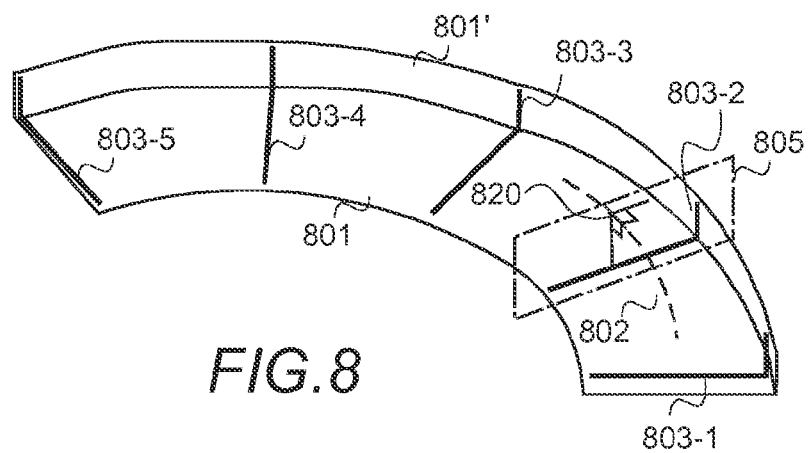
FIGS. 8 to 11 illustrate different exemplary modeling views.

In the illustrated example of FIG. 1A, the means 106 to define the one or more GGSs, or more precisely means to define guide information for creation of the one or more GGSs, comprise a primary (master) steering curve, (PSC) 102 which is associated with information needed to create one or more repetition points (RPs) and with information on an angle 151. The primary steering curve may be called also a primary guideline. There are no restrictions to the shape of the PSC; it may be a straight line, a curved line, a circle, a half circle, a spline, etc. The information needed to create the one or more RPs (or spacing points) may be coordinates for an RP, and/or information indicating a distance between two consecutive RPs, for example. Further examples of the information needed to create the one or more RPs are described below, especially with FIGS. 2 and 3. The angle defines the direction 150 of an GGS 105 compared to the direction of the PSC, when the GGS 105 is created on an RP 120 on the PSC 102. For example, using 90° angle and a straight PSC, parallel GGSs will be created and using 90° angle and a half circle PSC, fanned GGSs will be created. The angle 151 is an angle in a three-dimensional space. Typically such an angle is a composition of an angle in an x-y plane and an angle in an x-z plane (as is illustrated in FIG. 8), and the value of the angle in the x-y plane may be the same as the angle in the x-z plane, or different than the angle in the x-z plane. For the sake of clarity, herein the term angle is used to cover the composition, and in the examples it is assumed that the angle in the x-y plane is the same as the angle in the x-z plane without restricting the examples to such a solution. The above disclosed information is sufficient to create one or more GGSs but additional information to create other than straight-type of GGSs may be provided in the guide information. For example, a function defining the shape of GGSs may be given in the additional information to obtain curvy GGSs or wave-like GGSs, for example.

Assuming that definitions 130 of an RO, called herein "RO definition", define the GDS 101, one repetition point 120 on the PSC 102 that is associated with the angle 151, a GGS 105 will be created, and the intersection of the GDS 101 and the GGS 105 defines at least basic geometry of the RI 103 of the RO at that specific intersection. The basic geometry is a curve (line) with finite length that is a 2D or 3D representation of the article modelled at least initially. Since in the illustrated example GDS 101 is a curvy surface, the RI 103 of the RO is also depicted as a curvy line.

The exemplary embodiment illustrated in FIG. 1B, differs from the embodiment illustrated in FIG. 1A in that respect that instead of comprising guide information with which to create GGSs, the additional means 106' comprise information for creating one or more geometry guide curves (GGCs). A GGC defines the direction of an RI created by the GGC. The GGC is in principle an infinite curve and it may be called a guide curve, or a spacing curve.

In the illustrated example of FIG. 1B, the means 106' to define the one or more GGCs, or more precisely means to define guide information for creation of the one or more GGCs, comprise a primary (master) steering curve (PSC) 102 which is on a plane defined by the GDS and associated with information needed to create one or more repetition points (RPs) and with information on an angle 151'. The angle defines the angle between the PSC and a GGC 105', when the GGC 105' is created on an RP 120 on the PSC 102. The angle may be given by means of an "angle line" 107, wherein the angle 151' is the angle between the "angle line" and the PSC on a plane defined by the GDS, or the angle may be given by inputting the angle value. It should be appreciated that additional information for GGCs may be given. For example, there may be with a function that defines the shape of GGCs to be an arc with a certain radius, or a zigzag-line, etc.

Assuming that definitions 130' of an RO, i.e. "RO definition", define the GDS 101 and that the PSC is on the GDS (on the plane defined by the GDS), one repetition point 102 on the PSC 120 that is associated with the angle 151', a GGC 105' will be created having a perpendicular 105'n. The direction of the perpendicular 105'n may be defined to be a default value, such as the plane defined by the GDS, or parallel to z coordinate axis, or a user may define it. Intersections 105a, 105b of an edge of the GDS 101 and the GGC 105' define endpoints of a curve segment that goes along the GDS between the endpoints thereby defining at least basic geometry of the RI 103 of the RO at that specific point. In other words, one could say that a curve segment is created from the repetition point 120 extending a curve from the repetition point to the edges of the GDS at the angle 151'. As in the above, the basic geometry is a curve (line) with finite length that is a 2D or 3D representation of the modelled article. Since in the illustrated example GDS 101 is a curvy surface, the RI 103 of the RO is also depicted as a curvy line.

It should be appreciated that in a further embodiment both additional means, i.e. means 106 described with FIG. 1A and means 106' described with FIG. 1B, are implemented. For example, if a PSC 120 is on a GDS 101, one or more GGCs are created, but if the PSC 120 is not on the GDS, one or more GGSs are created. Another example is that when there are two or more GDSs, regardless whether or not a PSC 120 is on one of the GDSs, one or more GGSs are created; if the PSC 120 is on one of the GDSs, the GGSs are created to be perpendicular (or using another default angle value) to the one of the GDSs, for example.

As is evident from already from the above examples, there is no need to have a prior modeled object modeling a real world article in order to be able to define a GDS; one or more GDSs may be freely defined and a GDS may exist as a standalone aid surface that is never associated with an object that models a real world article. However, it should be appreciated that a GDS may be associated with an object that models a real world article, or its surface.

It is also evident that even a curved GDS may be used as it is; there is no need to represent a complex shaped GDS, or a combination of GDSs, through meshes, for example through triangle meshes.

In the following examples repetition instances are created by using straight-type of GGSs without restricting the examples to the solution. It is apparent for one skilled in the art how to implement the examples when repetition instances are created by using GGCs and/or other shape of GGSs.

The angle between the PSC and the one or more GGSs may be freely given/defined, with the restriction that the angle between PSC and GGS in the plane defined by PSC cannot be 0° or 180°, i.e. PSC and GGSs created in RPs on the PSC cannot be parallel to each other. In other words they are in an angle ensuring that they are not aligned. Allowing PSC and GGS being parallel would result that GGSs simply would be superimposed, and that is avoided by the restriction. However, in the following examples it is assumed that a default angle of 90° is used, and hence the angle is not separately defined, without restricting the examples to such a solution. The 90° angle is used for the sake of clarity, and since for a modeler the fact that the one or more GGSs are perpendicular to the GL, is the easiest way to piece together how the one or more GGSs will appear in the model, thus facilitating the modeling.

Further, in the examples below it is assumed that the guide information defines at least a PSC and one or more RPs, without restricting the examples to such a solution.

Figure 2:
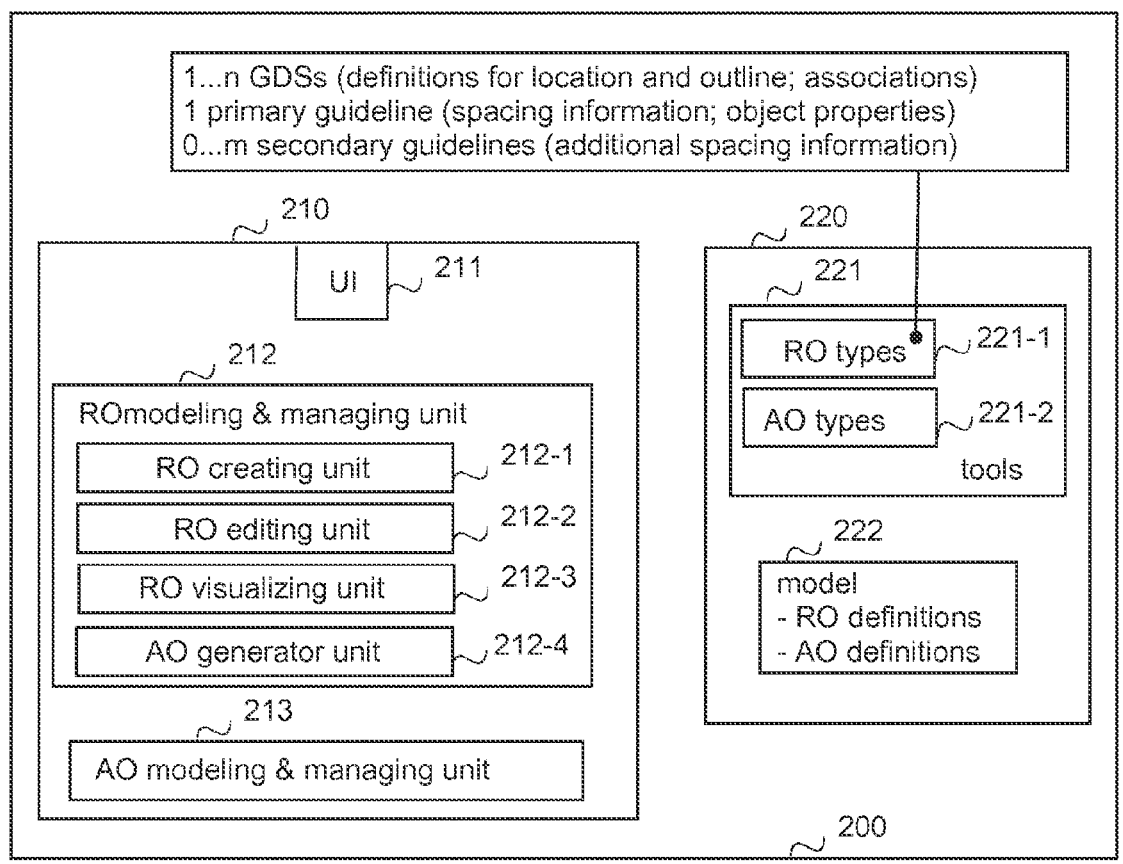
FIG. 2 shows a simplified architecture of an exemplary system and a schematic block diagram of an exemplary apparatus.

FIG. 2 illustrates a simplified modeling system describing only some logical units with their operative connections, the implementation of which may deviate from what is presented. It is obvious to a person skilled in the art that the system may also comprise other functions and structures that need not be described in greater detail here. The more detailed structure of the system is irrelevant to the actual invention.

The modeling system 200 illustrated in FIG. 2 is a simplified modeling system that comprises one or more apparatuses 210 (only one shown in FIG. 2) and one or more data storages 220 (only one shown in FIG. 2) or memories that may be external data storage to an apparatus or an internal data storage or partly external and partly internal.

The apparatus 210 may be any computing apparatus that can be configured to create and/or edit and/or view and/or output information from a model. For that purpose the apparatus 210 comprises one or more user interlaces 211, an RO modeling and managing unit 212 and an actual object (AO) modeling and managing unit 213. Examples of such apparatuses include a user terminal or a work station, such as a laptop, a smartphone, a personal computer, a tablet computer, a field device, an e-reading device, or a personal digital assistant (PDA), or a server, like a cloud server or a grid server.

A user interface 211 is the interface of the user, i.e. the person processing the model, to the modeling system. The user can create a model, modify a model, study it, output desired drawings and/or reports of the model, view the model, input information to the model, etc. by using the one or more user interfaces 211.

The RO modeling and managing unit is for ROs. In the illustrated example the RO modeling and managing unit 212 comprises at least one of the following units (sub-units): an RO creating unit 212-1, an RO editing unit 212-2, an RO visualizing unit 212-3 and an AO generator unit 212-4. However, all the units the RO modeling and managing unit 212 comprises may be integrated to one unit forming the RO modeling and managing unit, or some of the units may be integrated to each other. Exemplary functionalities of the units are described in more detail below.

The AO modeling and managing unit 213 is for AOs (actual objects). Basically it is for conventional modeling or any further development of the conventional modeling in which an article is modeled as a separate object defining at least geometrical properties of the object and its location in the model. Such an object is called herein as an AO (actual object). Typically an AO is given its creation point or points, the amount of creation points depending on the article to be modeled by the AO and the modeling application used, and values for different parameters representing the physical values of the article. Examples of creation points include a starting point and an ending point of the object, or creation points defining outlines of the AO. A plurality of properties can be associated with each AO that can detail in addition to the location and geometry of the AO, the manner of connectivity of the AO to other AOs, materials used to, or to be used to, realize the AO, such as concrete, wood, steel, and other suitable properties. AOs may be created using different kind of assisting tools, such as virtual objects described in an U.S. patent application Ser. No. 13/915,561, assigned to Tekla Corporation, the virtual objects being intended especially to assist to model rebars. However, the functionality and implementation of the AO modeling and managing unit 213 bears no significance to the invention and hence it is not described in more detail herein.

It should be appreciated that the units (including sub-units) may be separate units, even located in another physical apparatus providing the functionality, the distributed physical apparatuses forming one logical apparatus providing the functionality, and/or a unit may be integrated to another unit in the same physical apparatus.

In the illustrated example, the data storage 220 comprises for the modeling application different tool definitions 221, the tool definitions comprising one or more different RO types (RO type definitions) 221-1 for one or more repetitive articles and one or more different AO types (AO type definitions) 221-2 for articles to be modelled as AOs (separate objects), i.e. for non-repetitive articles.

In the illustrated example, the RO type definitions 221-1 comprise, as minimum definitions for an RO, definitions for a GDS and for a PSC. The definitions for a GDS, i.e. a GDS definition, are at least for defining a location and exterior outline (boundary, contour) of one or more (1 ... n) GDSs. Further, in the illustrated example, the RO type definitions contain, for an RO, as an optional feature of the GDS definition, associations to associate a GDS to one or more other GDSs and/or to one or more AOs. In the example, definitions of a PSC, called herein "PSC definitions", are for defining the PSC (shape and direction) with spacing information and initial object properties. Further, in the illustrated example, the RO type definitions comprise, as an optional feature, possibility to define zero or more (0 ... m) secondary (slave) steering curves (SSC) to provide additional spacing information. Spacing information controls the spacing, orientation, rotation and location of RIs of the repetitive articles, Difference between the PSC and an SSC is that the PSC defines the number and/or spacing of RIs and one or more properties of the repetitive article, whereas an SSC can change the spacing and/or orientation of GGSs, and hence orientations of corresponding RIs, and/or split a continuous GGS to a poly-GGS and thereby to an RI depicted by a poly-representation. In other words, an SSC provides more limited functionality to alter the geometry and characteristics of the RO, and RIs created using the RO, (and hence actual articles) than the PSC but with help of these SSCs it possible to define more complex GGSs comprising multiple planes with boundary, and after the geometry, location and orientation of the GGSs.

The one or more AO types 221-2 are provided to be used for creating one or more AOs. However, in future it might be that the tool definitions comprise only the RO types, in which case also the AO modeling and managing unit 213 may be left out.

In the illustrated example, the data storage 220 comprises also one or more models 222, or more precisely zero or more RO definitions defining corresponding number of ROs and/or zero or more AO definitions defining corresponding number of AOs.

To summon up a basic difference between an AO type and an RO type, an example of modelling three stiffeners on an I-beam, the stiffeners having the same characteristics, is used. When RO type is used, one RO is created, the RO being depicted with three RIs, whereas when AO type is used, three different AOs are created.

The modeling system illustrated in FIG. 2 represents the simplest modeling system. In larger modeling systems, the apparatus may be a terminal and the data storage a database with which the terminal communicates via a server. In such a system, the server may be configured to perform one or more of the RO modeling and managing unit functionalities. The data storage may be any kind of conventional or future data repository, including distributed and centralized storing of data, managed by any suitable management system. An example of distributed storing includes a cloud-based storage in a cloud environment (which may be a public cloud, a community cloud, a private cloud, or a hybrid cloud, for example). The implementation of the data storage, the manner how data is stored, retrieved and updated, and the location where the RO modeling and/or RO managing are performed are irrelevant to the invention. Further, the modeling system may comprise several terminals and servers with databases, which are preferably integrated to be visible to the user as one database and one database server.

In the following, the invention will be described by using an exemplary evolved system that utilizes a run-time database comprising information to be stored and already stored in a disc memory of an apparatus, without restricting the invention thereto. In another embodiment of the invention, an object-oriented database or a relation database, for example, can be utilized and used over a network, for instance. Further, in the following rebars are used as an example of a repetitive article without restricting the examples to rebars. For example, in FIG. 8, RIs could be triangle-shaped stiffeners, L-shaped concrete or wooden support beams, etc.

Figure 3:
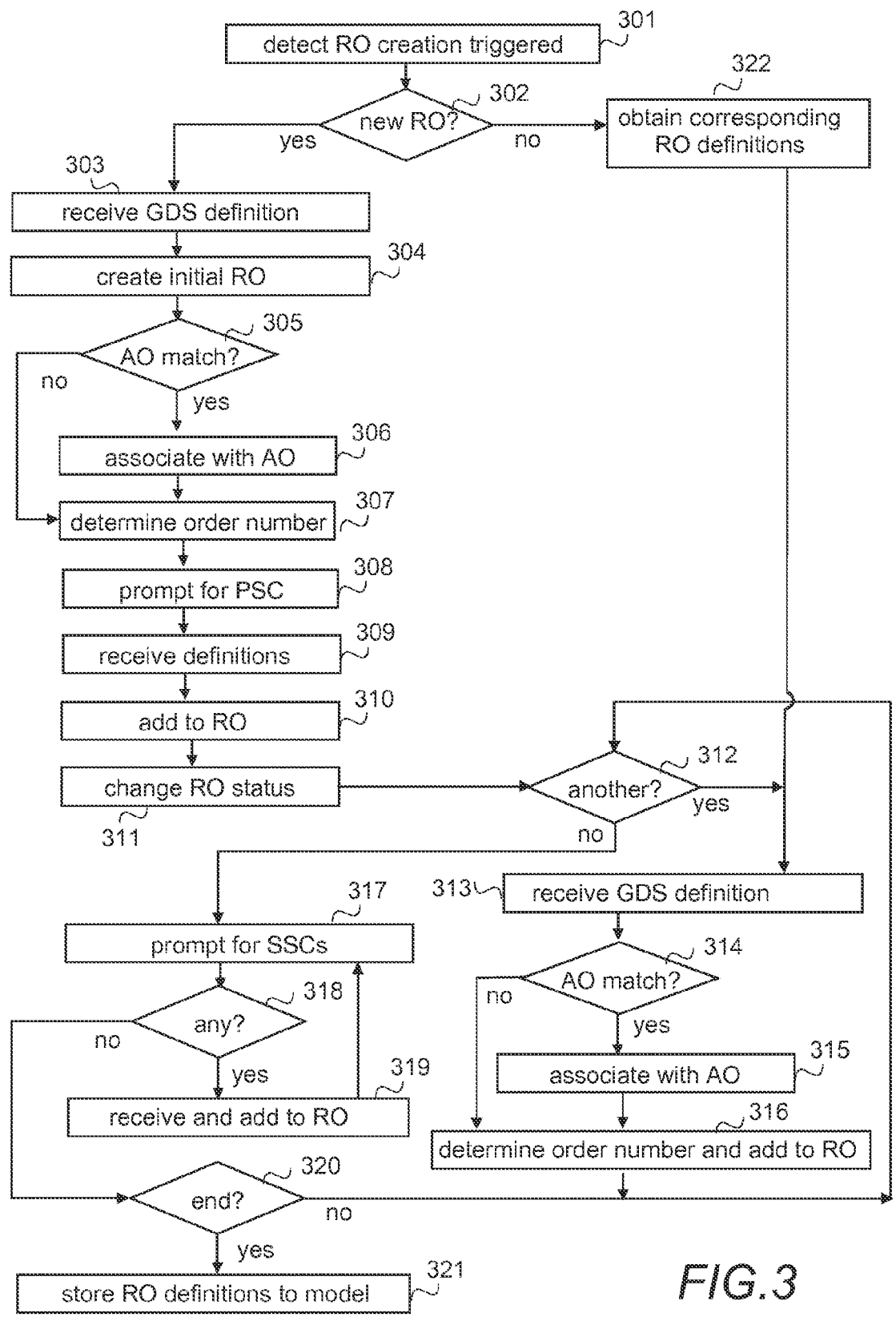
FIGS. 3 to 7 illustrate different exemplary functionalities.

FIG. 3 is a flow chart illustrating one example of creation of an RO, or amending the RO by adding one or more GDSs. More precisely, it illustrates an exemplary functionality of the RO creating unit. In the illustrated example, it is assumed, that when a new RO is created, one GDS is first defined, then a PSC is defined, and then zero or more additional GDSs will be defined, without restricting the example to such a solution. For example, PSC may be defined after all or some GDSs are defined.

Referring to FIG. 3, it is detected that an RO creation is triggered (step 301), and it is checked in step 302, whether or not it was triggered to create a new RO.

If a new RO is to created (step 302), a GDS definition is received in step 303 as a user input. The GDS definition comprises information defining the GDS. The GDS, if it is defined to be a plane (plane surface), may be defined like any other plane by three points that are not located on the same straight line (with a default outline). For example, the user may input information defining any rectangle or polygon shape, or selects a surface of an AO or a previously created GDS. The GDS may be in any arbitrary position in the three-dimensional space and it can be moved arbitrarily, for instance, by rotation, reflection, shifting horizontally or vertically, etc. The GDS may be a planar surface, a curved surface, a wavy surface, an undulating surface, a cylindrical surface, a conical surface, etc. In other words, there are no restrictions to the form of the GDS and how the GDS is defined, as long as the GDS is a finite (closed, definite) surface having at least one dosed exterior contour.

After receiving the GDS definition, initial RO definition is created in step 304. Then it is checked in step 305 whether or not one or more AOs are dose enough, and hence match with the GDS. For example, if the GDS locates on (exactly or within a marginal) an AO's surface, for example on a concrete wall object, the AO is dose enough and an AO match is detected. It should be appreciated that one or more different rules with which it is possible to determine (conclude) that a GDS matches (enough) with an AO may be used. Further, a user may be prompted to verify a match or indicate a matching AO. In any case, GDS remains as an aid surface for creating RIs and part of RO definitions, and it will not be or become part of AO definitions.

If at least one AO match is found (step 305) the GDS definition is associated in step 306 with the matching AO in the initial RO definition. For example, an object identifier of the matching AO may be added to the GDS definition.

Then, or if no AO match is found (step 305), an overlap order number is determined for the GDS in step 307. The overlap order number defines the order of GDS in case there are one or more overlapping co-linear GDSs of different ROs. For example, to create a reinforcement mesh, one needs to create two ROs with overlapping co-linear GDSs whose PSCs crosses over each other to create the RIs of the reinforcement mesh. Basically, the overlap order number may be determined so that if there are no previous GDSs, the order number is one, and the first overlapping co-linear GDS will have two as the order number, etc.

Then the user is prompted in step 308 to add a PSC, or more precisely to add a PSC definition. The PSC definition defines the spacing information and object property information for RIs.

The spacing information comprises at least information relating to starting and ending of the PSC and information based on which RPs on the PSC can be created. The information relating to starting and ending of the PSC may be provided by setting the start point of the PSC be fixed or free and the end point of the PSC to be fixed or free, regardless of the setting of the start point. When the start/end point is set free it will be extended automatically, in principle to infinity, i.e. to have no specific starting/ending point, and then it does not limit the area/volume whereto repetitions may be created. When the start/end point is set fixed, the PSC is not extended, and it limits the area volume whereto repetitions may be created, since repetitions points are created only on the PSC.

The information based on which RPs on the PSC can be created may define a constant spacing between the RPs, a target spacing between the RPs, exact number of RPs and one or more rules by which the spacing and/or location can be calculated, exact locations (exact spacing) of the RPs (inherently also defining the exact number) or a rule defining a repetitive pattern for the spacing, for example. An example of a repetitive pattern is to have 3 RPs so that spacing from the middle point to an outer point is 100 mm and then repeat the combination of the 3 RPs so that spacing between two subsequent middle points is 600 mm. Further, the information may define a point used as a starting point for point location calculation, and/or an offset to the start point of the PSC and/or an offset to the end point of the steering curve. Hence, there are no limitations for the content of the information based on which RPs on the PSC can be created as long as the actual locations of RPs on the PSC can be calculated/determined from the information.

The object property information defines one or more physical characteristics for the repetitive article which are applied to the RIs created on the basis of the PSC. In other words, the object property information defines one or more properties (characteristics, features) that are common to articles, or more precisely to corresponding RIs, that originate from the PSC. The object property information comprises at least information defining geometry at least roughly, for example by defining a cross section geometry, or outlines of a cross section, and it may be complemented at different phases of modeling. For example, for a rebar, the geometry may be at first "a line with 12 mm thickness", and just before manufacturing phase the information may be completed to be "deformed rebar with 16 mm diameter". Another example is that for a column, the geometry may be at first "a line with 200 mm thickness", that will be completed to be a specific type of H-section column. The object property information may inherit some properties from an AO the GDS is associated with, if the GDS of the PSC is associated with an AO. For a rebar RO, the object property information may define size (diameter, for example), grade, name, class, finish, bending radius, start hooks, end hooks, cranking, threading, anchor device, and/or one or more offsets, for example. An offset is perpendicular to the GDS, and it determines a distance between an actual location of an RI and the GDS whose intersection is used for creating the RI. The direction of the offset may be determined using the inward normal of the GDS, or the direction of the offset may be received as a user input, or there may be one or more rules how to determine the direction of the offset. For example, in a concrete wall, the GDS may locate on an outer surface of the wall but the rebars created by the GDS locates within the concrete at a distance from the outer surface, the distance being defined by the offset. The offset may be a combination of different offsets. For the above example, the offset may be a combination of a cover offset (cover distance) which, in the above concrete wall example depends on the concrete used and the location of the wall/wall surface (inner wall vs. outer wall), an additional offset inputted by a user (either as a common additional offset or as a GDS-specific offset) and an overlap offset (a plane offset, a surface offset) which depends on overlapping co-linear leg faces, one or more dimensions defined in corresponding object properties and the overlap order number. For example, if a mesh is used for a concrete wall, no additional offset is inputted, and vertical rebars are modelled first, the offset for the vertical rebars is the cover offset and the offset for the horizontal rebars is the sum of the cover offset and the diameter of the vertical rebars. Another example of a repetitive article with an offset is beams having an offset to an upper surface of a floor slab supported by the beams, the offset being for example the thickness of the floor slab.

When the PSC definition is received in step 309, it and the overlap order number are added in step 310 to the initial RO definition and the initial status of the RO definition is changed in step 311 to be RO definition for an RO.

Then in the illustrated example, the process continues to step 312 to prompt the user for another GDS for the RO. If another GDS for the RO is to be added (step 312), GDS definition is received in step 313, and it is checked in step 314 whether or not one or more AOs are close enough, and hence match with the GDS. The step is similar to the step 305 described above. If at least one AO match is found (step 314) the GDS definition is associated in step 315 with the matching AO. Then, or if no AO match is found (step 314), the overlap order number is determined in step 316, and the GDS definition is added in step 316 to the RO definition. There are no restrictions how the overlap order number is determined, it suffices that an GDS overlapping fully another GDS does not have the same order number than the other GDS. Then the process proceeds back to step 312 to prompt the user for another GDS for the RO. Hence, the user is able to control which GDSs belong to the same RO, regardless whether or not they touch each other. For example, in an example of FIG. 8 GDSs 801 and 801' belong to the same RO, in the example illustrated in FIGS. 9A to 9D, GDSs 901, 901' and 901" belong to the same RO, regardless of the definition order. The GDSs in FIGS. 8 and 9A to 9D may have the same order number, or there order number may be different.

If no further GDS is to be defined to the RO (step 312), the user is prompted in step 317 for one or more SSCs (additional steering curvers, secondary steering curves, additional guidelines, secondary guidelines). Definitions for SSC define additional spacing information, which comprises at least information relating to starting and ending of the SSC (independent from the definitions of primary and other SSCs) and information based which RPs on the SSC can be created. It should be appreciated that the number of RPs that are used for RIs is determined by the PSC. If definitions of an SSC results to a smaller number, the SSC may be ignored, or only the smaller number of RIs will be affected (rest of the RIs will be not affected) or some definitions overridden at least partly; if definitions of an SSC results to a bigger number, "extra" RPs may be ignored.

If an SSCs is to be defined (step 318), corresponding definitions are received and added in step 319 to the RO definition, after which the process proceeds to step 317 to prompt the user one or more SSCs.

If no SSC (or no further SSC) is to defined (step 318), the user is prompted in step 320 for whether or not to end defining of the RO. If the defining is not ended, the process proceeds to step 312 to prompt the user for another GDS for the RO.

If the defining is ended (step 320), the RO definition is stored in step 321 to the model.

If the RO creation was not triggered to create a new RO (step 302), in the illustrated example it is assumed to be created to add one or more GDSs to an existing RO. Therefore corresponding RO definition is obtained in step 322, after which the process proceeds to step 313 to prompt the user for another GDS for the RO.

The intersections 105a, 105b of an edge of the GDS 101 and the GGC 105' define endpoints of a curve segment that goes along the GDS between the endpoints thereby defining at least basic geometry of the RI 103 of the RO at that specific point.

As is evident from the above, using the RO type one can create RIs (and therefrom also AOs) without any AO being defined. Compared for example with a solution disclosed in U.S. Pat. No. 7,856,342 that requires at least one AO to be defined, RO type provides more versatile possibilities and is suitable to be used for modeling also other articles than those exactly inside of a previously created AO. For example, if in the example illustrated in FIG. 9A an AO associated with GDS 901" has the same size and shape as an AO associated with GDS 901', the size and shape being similar to GDS 901', by defining GDS 901" having a different size and shape, one may easily model RIs extending out of AOs.

Further, providing offsets and using them as described above with FIG. 3, enables the functionality to skip over a step of creating solids that is performed in prior art solutions in which a complex surface of an object is represented through meshes.

Figure 4:
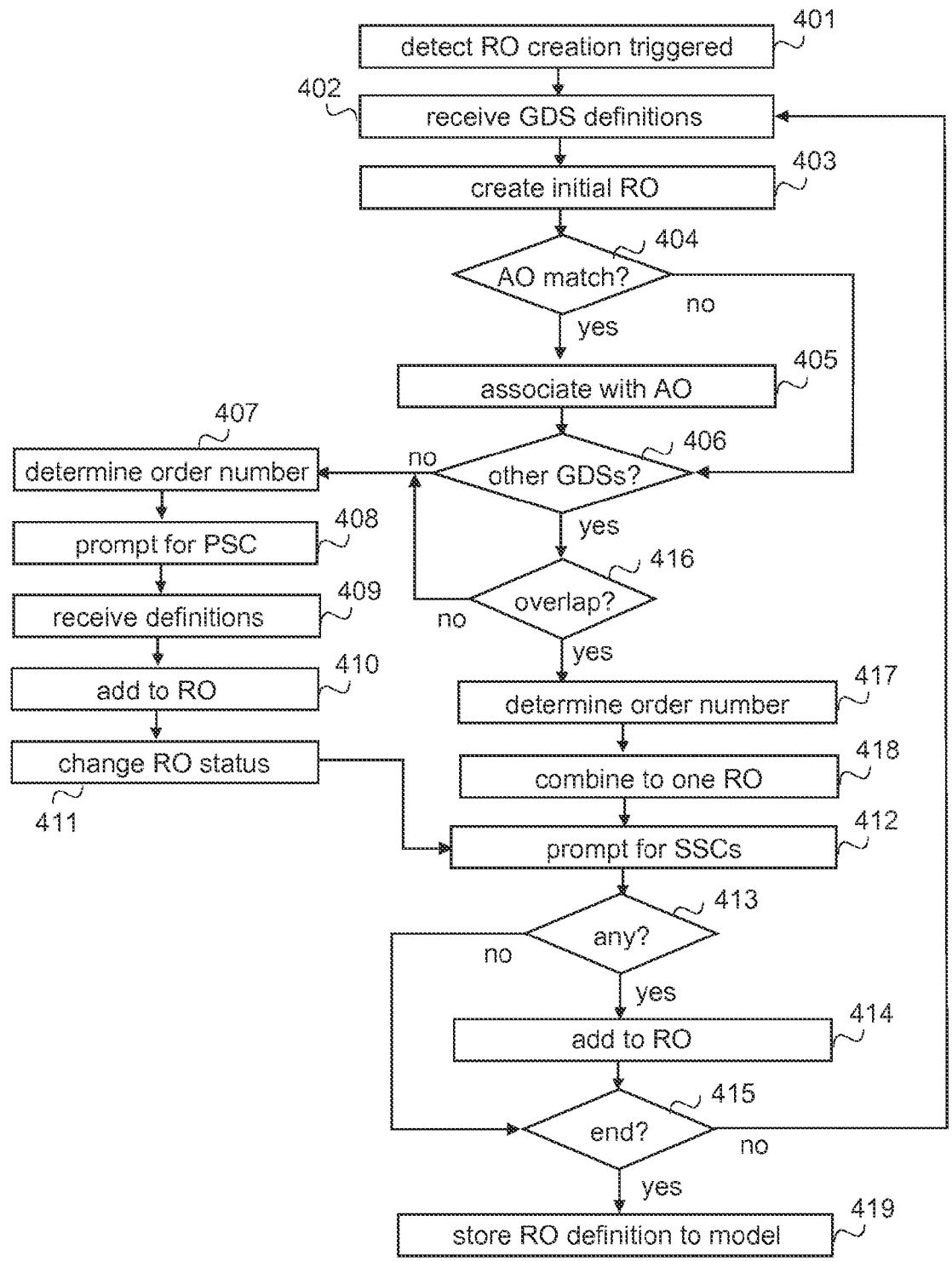

FIG. 4 is a flow chart illustrating another example of the creation of an RO. More precisely, it illustrates another exemplary functionality of the RO creating unit. In the example, it is assumed that information is inputted in a GDS by a GDS manner, without restricting different implementations of the example to such a solution.

Referring to FIG. 4, it is detected that an RO creation is triggered (step 401), and a GDS definition is received in step 402 as a user input. After receiving the GDS definition, initial RO definition is created in step 403. Then it is checked in step 404 whether or not one or more AOs are close enough, and hence match with the GDS definition. For example, if the GDS locates on (exactly or within a marginal) an object surface, for example on a concrete wall object, the AO is close enough and an object match is detected. It should be appreciated that one or more different rules with which it is possible to determine (conclude) that a GDS matches (enough) with an AO may be used. Further, a user may be prompted to verify or indicate a matching AO.

If at least one AO match is found (step 404) the GDS definition is associated in step 405 with the matching AO in the initial RO definition. For example, an object identifier of the matching AO may be added to the GDS definition. Then the process proceeds to step 406 to check, whether or not other, one or more previously defined GDSs are close enough. GDSs may be close enough if they overlap at least partly, or their outlines contact at least partly, or outlines are within a preset distance to each other, for example. Further, the user may have indicated in the GDS definition that this GDS is to be interpreted to be close enough to one or more other GDSs, or not to be close enough to one or more GDSs. For example, in an example of FIG. 8 GDSs 801 and 801' have one overlapping outline, in the example illustrated in FIGS. 9A to 9D, GDS 901 has one overlapping outline with GDS 901' and one overlapping outline with GDS 901" but GDSs 901' and 901" are not close enough. However, a user may have inputted information indicating that at least one of the GDSs 901, 901' and 901" is a separate (individual) GDS in which case there should be at least two PSCs.

If in step 406 it is detected that no close enough GDS exists, an overlap order number is determined for the GDS in step 407, and the user is prompted in step 408 to add a PSC, or more precisely to add PSC definition. However, in the example the order number may always be determined to be one in step 407 for non-overlapping GDSs.

When the PSC definition is received in step 409, it and the overlap order number are added in step 410 to the initial RO definition and the initial status of the RO definition is changed in step 411 to be RO definition for an RO. Then in the illustrated example, the process continues to step 412 to prompt the user for one or more SSCs (secondary/additional steering curves).

If SSCs are defined (step 413), corresponding definitions are added in step 414 to the RO definition, and it is monitored in step 415, whether the user ends the RO creation or continues. If the user continues, the process proceeds to step 402 to receive GDS definition.

If at least one previously determined GDS is close enough (step 406), it is checked in step 416 whether or not the GDSs are to be treated as overlapping surfaces. If one of the GDSs is within the other GDS, or overlaps more than a threshold value, or a user has input information indicating that a GDS is to be treated as an overlapping surface to one or more other GDSs, the GDS is an overlapping surface and the process proceeds to step 417 to determine an overlap order number for the GDS, for example by incrementing by one the biggest overlap order number of the one or more leg surfaces the processed GDS overlaps. Then the definitions for the RO are combined in step 418 to define one RO. For example, the definitions for the initial RO are included in the definitions already existing for the RO. Then the process proceeds to step 412 to prompt the user for one or more SSCs.

If the GDS is not an overlapping GDS (step 416), the process proceeds to step 407 to determine an overlap order number for the GDS.

If there are no matching objects (step 404), the process proceeds to step 406 to check whether or not other, one or more previously defined GDSs are close enough.

If the user ends the creation of ROs (step 415), the RO definitions are stored in step 419 to the model.

Figure 5:
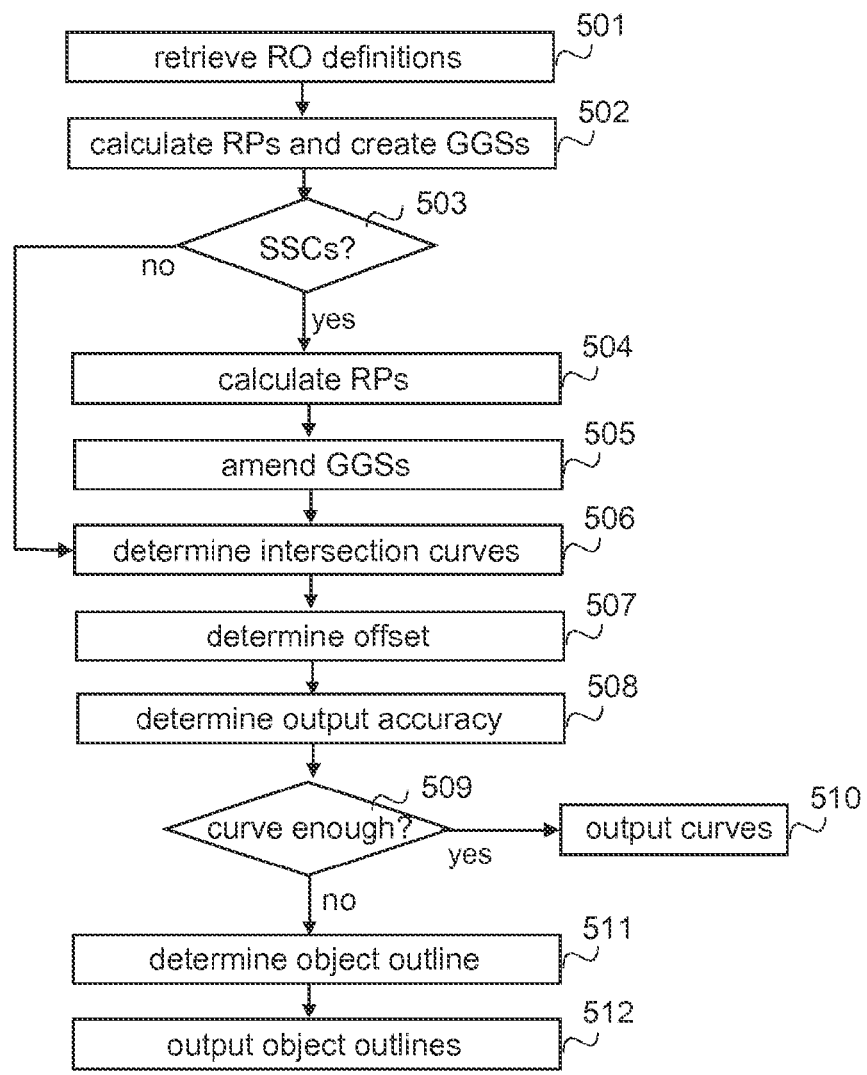

FIG. 5 is a flow chart illustrating visualizing of an RO. More precisely, it illustrates an exemplary functionality of the RO visualizing unit. In the example it is assumed that the ends of the PSC are free, without restricting the functionality to such a solution.

Referring to FIG. 5, in order to visualize an RO, corresponding RO definition is retrieved (or obtained) in step 501. The PSC definition of the RO definition is used for calculating in step 502 RPs and for creating GGSs, so that there is a GGS in each RP that is within the GDS(s) of the RO. For example, in FIG. 9B, three RPs 920, 920' and 920" are illustrated on PSC 902, and in FIG. 8 one RP 820 is separately illustrated. Further, in FIG. 8 one GGS 805 is illustrated on PSC 802.

Figure 11:
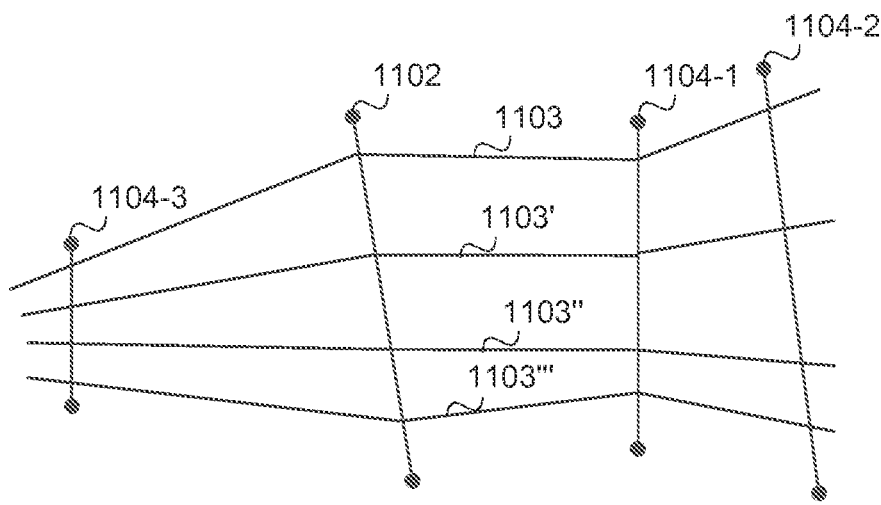

Then it is checked in step 503, whether or not there are one or more SSCs. If there is, a number of secondary RPs corresponding to the number of RPs on the PSC is determined in step 504 and the spacing between the secondary RPs and/or rotation of a GGS is determined in step 504 according to the definitions (spacing information) of the SSC, and GGSs are amended in step 505 to pass via all RPs. An example is illustrated in FIG. 11, in which a PSC 1102 defines the number of RPs, and only the spacing between the RPs on the SSCs 1104-1, 1104-2, 1104-3 and orientation of GGSs 1103, 1103', 1103", 1103''' (illustrated by corresponding cross-section) is changed. In other words, with help of these SSCs it is possible to define more complex GGSs comprising multiple planes with a boundary, and alter the geometry, location and orientation of the GGSs. In the illustrated example, an SSC is for "forced points" through which a GGS passes by, and the angle of the GGS is changed only if the SSC is followed by another SSC (in the example the angle changes in 1104-1 since it is followed by 1104-2, but the angle is not changed in 1104-2 and 1104-3). However, it could be possible to use an SSC to change the angle of the GGS so that if an SSC is not followed by another SSC, GGS would continue from the SSC in a certain angle to a direction away from the PSC, and that may be implemented to all GGSs or only to those GGSs for which an RP is defined in the SSC.

Then, or if there are no SSCs (step 503), intersections curves are determined in step 506, an intersection curve being an intersection of the one or more GDSs received in the RO definition and a GGS (or if the GGS comprises several GGSs intersection curves of the several GGSs and the one or more GDSs). Further, one or more offsets are determined in step 507. The offset may be an offset from the GDS, as described above, or a distance from a contour (outline) of the GDS. The distance from the contour, illustrated by 930 in FIG. 9C, may correspond to a cover offset and/or depend on the overlap order number and/or may be user inputted distance, or any combination thereof. It should be appreciated that the result of step 507 may be that the value of an offset is zero.

Also the output accuracy is determined in step 508 to determine how detailed representation is needed. If a line is detailed enough (step 509), the intersection curves, taking into account the offsets, are outputted in step 510. If the line is not enough (step 509), object outline, for example a diameter of a rebar or a profile of articles to be illustrated, is determined in step 511, and the object outline is outputted, taking into account the offsets, in step 512. It should be appreciated that when the repetitive article has a more complex outline, such as a T-beam, or I-beam, corresponding object outline may be outputted in step 512.

Figure 9A:
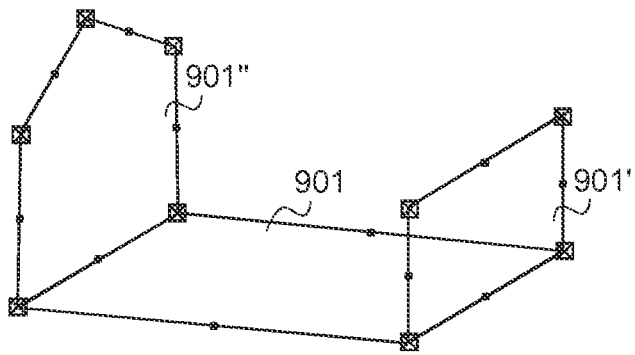
Figure 9B:
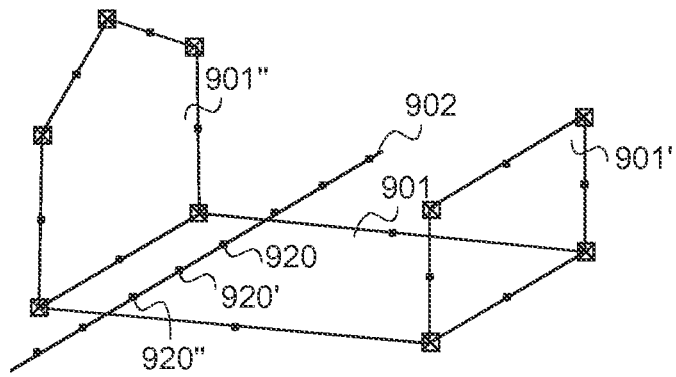
Figure 9C:
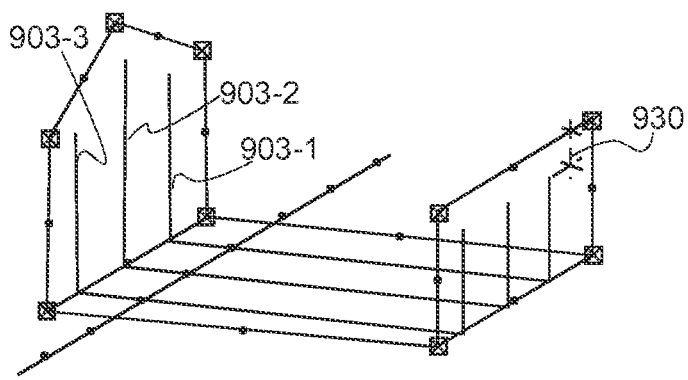
Figure 9D:
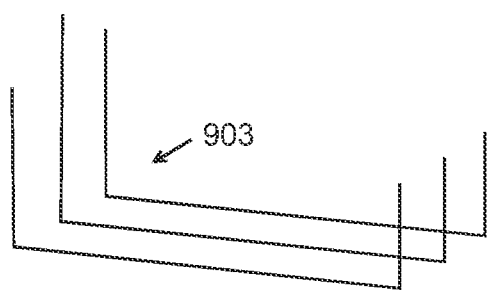

As illustrated in FIG. 8 and in FIG. 9C, the RIs 803-1, 803-2, 803-3, 803-4, 803-5 in FIG. 8 and the RIs 903-1, 903-2, 903-3 in FIG. 9C may be outputted (displayed to the user) with GDSs and PSCs, even with GDS definition points and RPs, or the RIs may be outputted without them, as illustrated by the set 903 of three RIs in FIG. 9D. Further, as is clear from FIGS. 9A and 9D, RO provides a way to model RIs that pass from a GDS to another GDS, and to further GDSs, or from an AO to another AO, and to further AOs or extending out of an AO.

Figure 6:
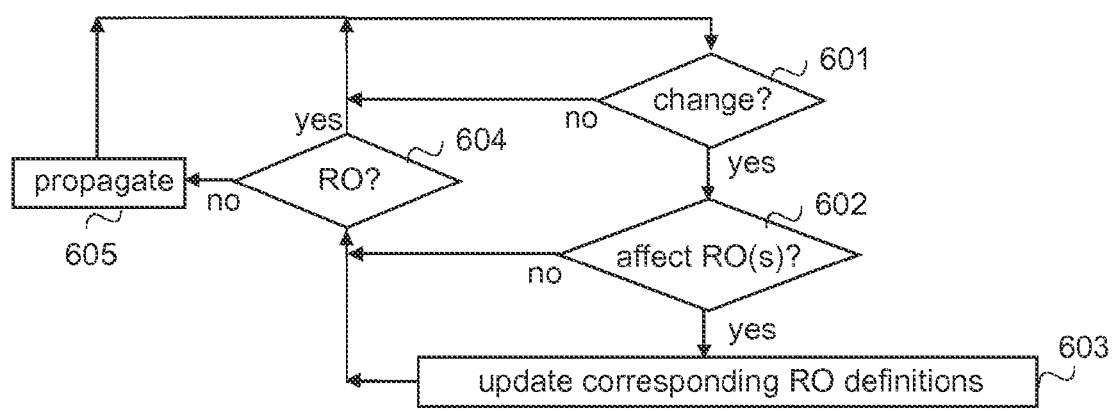

FIG. 6 is a flow chart illustrating editing of an RO. More precisely, it illustrates an exemplary functionality of the RO editing unit. The described process may be run all time as a background process. A change may be that an AO is edited, or a GDS is edited, or a PSC and/or SSC is edited. Editing means that something is modified and/or moved and/or added and/or inserted and/or deleted and/or removed and/or cut and/or combined, and/or merged, etc. In the illustrated example it is assumed that a change of an AO is always propagated to an RO. However, it should be appreciated that a user may input instructions that a change of an AO is not propagated to an RO.

Referring to FIG. 6, changes in the model are monitored in step 601. When a change in the model is detected, it is checked in step 602 whether or not the change affects to at least one RO. If it affects, corresponding RO definition is updated in step 603. For example, if rebars are created first as an RO, and then the concrete structure at least partly around the rebars is created as an AO, the RO is associated with the AO either automatically or in response to a user input. (If the concrete structure is created as an independent RO, the ROs may be associated to each other.) Naturally, if the RO is displayed, the updated definitions reflect to what is displayed.

After the RO definition is updated (step 603), or if the change does not affect to one or more ROs (step 602), it is determined in step 604 whether the change was made only to an RO or to an AO. If the change was made only to an RO, the process continues monitoring of the changes (step 601). If the change was made to an AO, the change is propagated in step 605 to possible other AOs, and the process continues monitoring (step 601). (A propagated change may be detected as a change in step 601 thereby causing looping the steps until all propagation has been performed.)

Figure 10A:
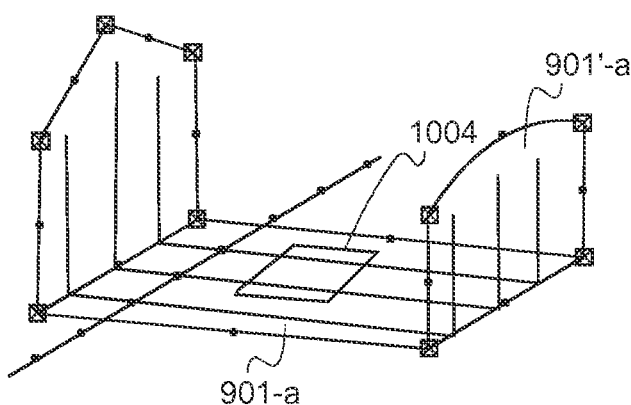

For example, FIG. 10A illustrates a situation in which two changes to the example illustrated in FIGS. 9A to 9D have been made: an AO associated with the GDS 901' is amended to have an arched upper end, and the GDS 901'-a is amended correspondingly as well as RIs ends; and the GDS 901 is amended by a cut 1004 to be GDS 901-a, added just when FIG. 10A is captured. As can be seen from FIG. 10A, a cut may create inner loops to a GDS.

Figure 10B:
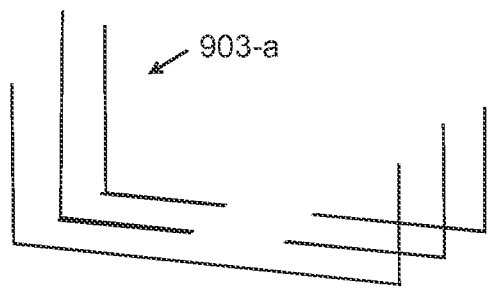

The amendments to the AO and to the GDS are propagated to the RIs, the amended RIs 903-a being illustrated in FIG. 10B. However, amendments to the RO are not propagated to the AO. Therefore, since the cut 1004 was made to the GDS 901, not to an AO, nothing is changed in the AO. For example, if the AO models a concrete slab around the GDS, adding the cut 1004 to GDS 901 will not cause an opening being created to the concrete slab, whereas if an opening would have been added to the concrete slab, a corresponding cut would be propagated to the GDS, and hence to RIs. The feature that nothing is propagated from an RO to an AO may be used, in addition to cut, to create "bond extensions" of rebars, for example, by extending the GDS contour above the outline of the concrete structure. For example, in the solution disclosed in the U.S. Pat. No. 7,856,342, modeling bond extensions are possible only if each rebar having the bond extension is modeled as a separate AO.

Figure 7:
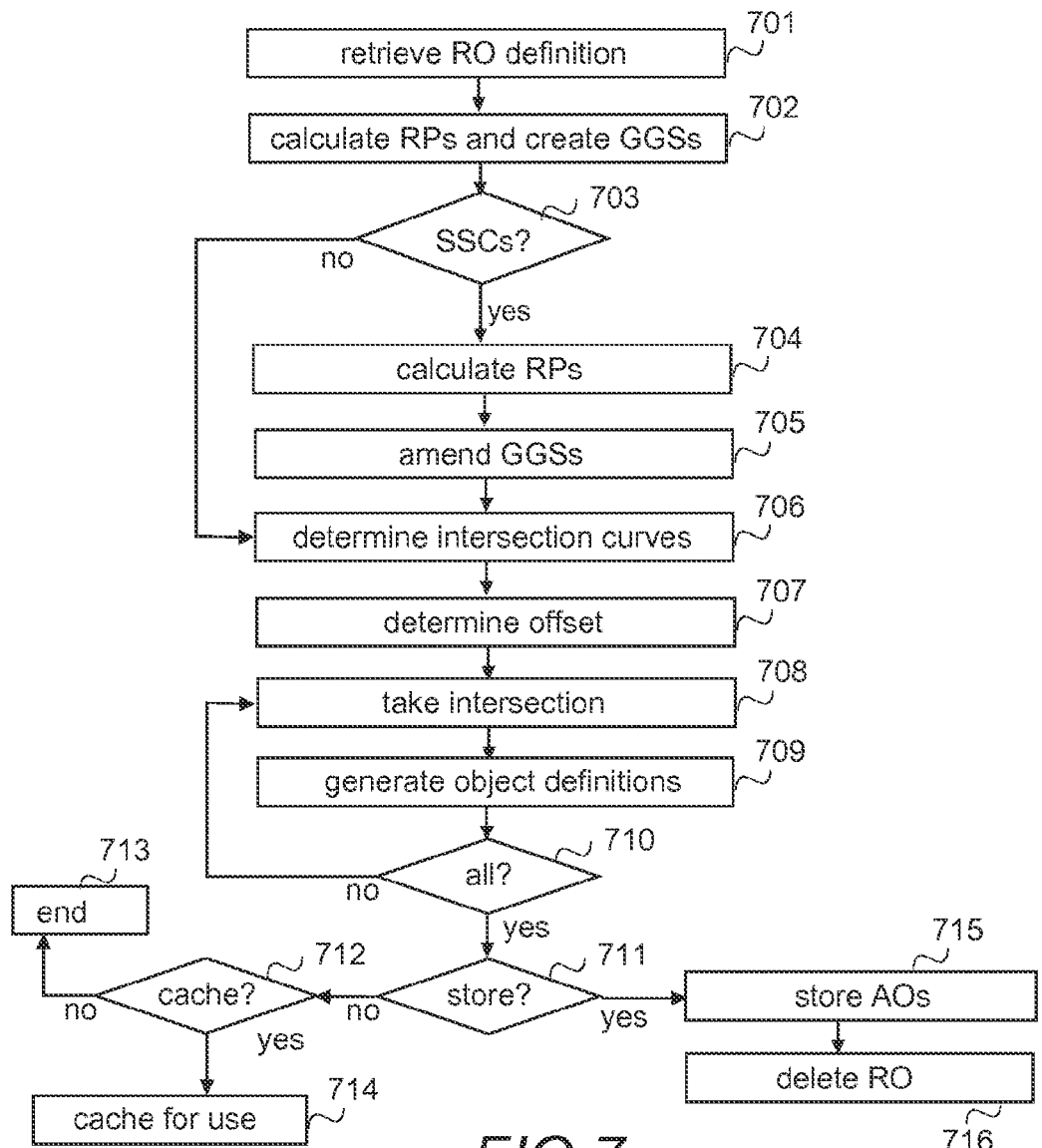

Sometimes, for example for reporting or for creating different drawings or for estimating how many and what type of repetitive articles are needed, one may need AO information instead of RO and RIs. FIG. 7 is a flow chart illustrating how an RO is exploded to AOs, at least temporarily. More precisely, it illustrates an exemplary functionality of the AO generator unit.

Referring to FIG. 7, in order to generate AOs from an RO, corresponding RO definition is retrieved (or obtained) in step 701. From the RO definition the PSC definition is used for calculating in step 702 RPs and for creating GGSs, so that there is a GGS in each RP that is within the one or more GDSs. Then it is checked in step 703, whether or not there are one or more SSCs. If there is, a number of secondary RPs corresponding to the number of RPs in the PSC is determined in step 704, and GGSs are amended in step 705 to pass via RPs.

Then, or if there are no SSCs (step 703), intersection curves are determined in step 706. Since in the illustrated example the repetitive article is an article with an offset, i.e. a rebar, an offset is determined in step 707.

Then an intersection curve is taken in step 708 to be processed, and object definitions defining the AO are generated (created) in step 709 using the intersection curve and the object properties, including different offsets, defined in the PSC definition. After that it is checked in step 710, whether or not all intersection curves have been transferred into AOs. If not, the process proceeds to step 708 to take an intersection curve to be processed. In other words, steps 708 and 709 are repeated as long as there are intersection curves to be processed, When all intersection curves have been transferred into AOs (step 710), they are ready to be used for the intended purpose. For example, in an embodiment no separate RO visualizing unit is used but the AO generator unit is used also for providing visualizations of the objects.

However, since there may be a need to store the AOs persistently to the model, in the illustrated example it is determined in step 711 whether or not to store the AOs. This may be determined based on the purpose why the generation (creation) of the AOs was triggered, or the user may be prompted to provide a corresponding input, or the user may input (without being prompted to do so) instruction indicating "store" and if no such input is received it is deduced to correspond "not to store".

If the AOs are not to be stored (step 711), in the illustrated example it is determined in step 712 whether or not to cache the AOs. This may be determined based on the purpose why the generation (creation) of the AOs was triggered, or the user may be prompted to provide a corresponding input, or the user may input (without being prompted to do so) instruction indicating "cache" and if no such input is received it is deduced to correspond "not to cache", and the process ends (step 713). If AOs are to be cached (step 712) they are cached in step 714 as long as the temporary model data is cached or a shorter period, for example as long as they are needed for a specific use. Examples of the specific use include reporting, data queries, generating drawings and visualizing (outputting) the model via a user interface to the user.

If the AOs are to be stored (step 711), the created AO definitions are stored in step 715 to the model as separate AO definitions and the corresponding RO is deleted in step 716 from the model, the deleting covering also a solution in which the RO definition is updated to be invalid for the model.

As can be seen from the above example, using an RO instead of several AOs, saves memory resources, use of processing resources, and in most cases speed up modeling, and yet the same information is obtainable. Hence, the usability of the model is increased, not sacrificed because of ROs. Further, compared to solutions in which an RI is defined by a user, the definitions defining how many RIs are to be created, the use of guide information in the above described manner is more logical to the user. Therefore creating ROs as described above is less prone to errors, more user-friendly and increases productivity.

The steps shown in FIGS. 3 to 7 are not in an absolutely chronological order, and they may be executed in a different order than given here, or simultaneously. For example, steps 305 and 306, i.e. associating an RO with one or more matching AOs, if such exists, may be performed just before the RO definition is stored to the model (i.e. between steps 319 and 320). Other functions may be carried out between the described steps or simultaneously with them. For example, the user may be prompted to provide object properties. It is also possible to leave out some of the steps shown in the Figures. For example, prompting the user on PSC and/or SSCs may be left out, or determining output accuracy and using curves, not outlines, may be left out. Further, it is possible not to allow storing of AOs obtained by exploding an RO. It is also possible to replace some of the described steps by a step that produces a corresponding end result. For example, if GGCs are used, in step 502 and 702 no GGSs are created but GGCs are created on one GDS and in case there is more than one GDS, one of them is selected (there are no restrictions on rules used for the selection), GGCs are created on the selected GDS and then the GGCs are extended to go along other GDSs until in the extension direction an edge of the GDSs belonging to the RO is reached. The thus obtained GGCs, or after they amended by one or more SSCs, are then used as the intersection curves described above.

Figure 12:
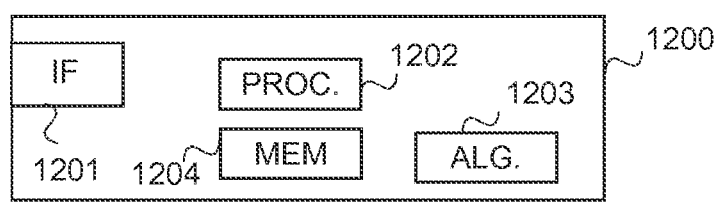
FIG. 12 is a schematic block diagram of an exemplary apparatus.

FIG. 12 is a simplified block diagram illustrating some units for an apparatus 1200 configured to be an apparatus comprising at least the RO modeling and managing unit. In the illustrated example the apparatus comprises one or more interfaces (IF) 1201 for interaction with a user, and possibly for receiving and transmitting information either wirelessly or over a wired link, a processor 1202 configured to implement at least the RO modeling and managing unit, or at least one of its sub-units functionality described herein with a corresponding algorithm/algorithms 1203 and a memory 1204 usable for storing a program code required at least for the RO modeling and managing unit. Generally the processor 1202 is a central processing unit, but the processor 1202 may be an additional operation processor, controller, control unit, micro-controller, a single-chip computer element, a chipset, or the like connected to a memory and to various interfaces of the apparatus. The memory 1204 is also usable for storing other possible information, like the model or the working copy of the model.

More precisely, each or some or one of the units and/or algorithms described herein may be configured as a computing device including at least a memory for providing storage area used for arithmetic operation and an operation processor for executing the arithmetic operation. Each or some or one of the units and/or algorithms described above may comprise one or more computer processors, application-specific integrated circuits (ASIC), digital signal processors (DSP), digital signal processing devices (DSPD), programmable logic devices (PLD), field-programmable gate arrays (FPGA), and/or other hardware components that have been programmed in such a way to carry out one or more functions of one or more embodiments/implementations/examples or to perform functionalities from different embodiments/examples/implementations. In other words, each or some or one of the units and/or the algorithms described above may be an element that comprises one or more arithmetic logic units, a number of special registers and control circuits.

Further, the memory 1204 may include volatile and/or non-volatile memory, for example EEPROM, ROM, PROM, RAM, DRAM, SRAM, double floating-gate field effect transistor, firmware, programmable logic, etc. and typically store content, data, or the like. The memory 1204 or memories may be of any type (different from each other), have any possible storage structure and, if required, being managed by any database management system. The memory may also store computer program code such as software applications (for example, for one or more of the units/algorithms) or operating systems, information, data, content, or the like for the processor to perform steps associated with operation of the apparatus in accordance with examples/embodiments. The memory, or part of it, may be, for example, random access memory, a hard drive, or other fixed data memory or storage device implemented within the processor/apparatus or external to the processor/apparatus in which case it can be communicatively coupled to the processor/network node via various means as is known in the art. An example of an external memory includes a removable memory detachably connected to the apparatus.

It should be appreciated that the apparatus 1200 may be configured to perform one or more of the functionalities described above with an example/embodiment/implementation and the apparatus 1200 may be configured to perform (combine) one or more functionalities from different examples/embodiments/implementations.

It will be obvious to a person skilled in the art that, as the technology advances, the inventive concept can be implemented in various ways. The invention and its embodiments are not limited to the examples described above but may vary within the scope of the claims.

What is claimed is:

1. A computer implemented method comprising:
running in a computer a modelling application that uses object instances to model one or more real world articles;
receiving, as a user input or as part of a model when the model is loaded, definitions defining at least one repetition object, a repetition object being one unit for creating one or more repetition instances to model a corresponding amount of occurrences of a repetitive article that is a real world article that may occur more than once and in a repetitive manner in a real world structure, definitions for a repetition object comprising at least one finite surface definition that defines a geometry definition surface and its location in a model, and at least one steering curve, definitions for a steering curve defining at least information on starting and ending of the steering curve and information based on which one or more repetition points may be created;
creating the at least one steering curve;
determining on the at least one steering curve one or more repetition points;
creating one or more geometry guide surfaces, a geometry guide surface being created on a repetition point with an angle in a three dimensional space to the steering curve so that the geometry guide surface is not aligned with the steering curve; and
creating one or more repetition instances of the at least one repetitive article by creating a repetition instance based on an intersection of the at least one geometry definition surface and one of the one or more geometry guide surfaces created.

2. The computer implemented method of claim 1, wherein the definitions for a repetition object further comprises property information, and the method further comprises:
determining from the property information one or more offsets, and
offsetting the at least one repetition instance from the intersection according to the one or more offsets.

3. The computer implemented method of claim 1, wherein the definitions for a repetition object further comprises property information, and the method further comprises generating from the at least one repetition instance and the property information corresponding object definitions, an object definitions defining a location, geometry and other properties for one object modeling one occurrence of the repetitive article.

4. The computer implemented method of claim 1, wherein the definitions for a repetition object further comprises at least one additional steering curve defining additional spacing information and the method further comprises:
determining one or more additional repetition points on the additional steering curve;
modifying the direction of the geometry guide surface in an intersection of the additional steering curve so that the geometry guide surface goes from the repetition point the geometry guide surface is created to a corresponding repetition point on the additional steering curve; and
using the modified geometry guide surface to create the at least one repetition instance.

5. The computer implemented method of claim 1, further comprising:
receiving definitions defining one or more actual objects, definitions for an actual object defining at least the object's location in the model and the object's geometry, the actual object modeling one occurrence of one real world article;
checking whether at least one of the one or more actual objects matches with the geometry definition surface; and
if a match is found, associating the geometry definition surface with the at least one of the one or more actual objects.

6. The computer implemented method of claim 1, further comprising:
detecting a change in the model;
in response to the change being performed to at least one actual object in the model, propagating the change to affected actual objects and repetition objects, an actual object modeling one occurrence of one real world article; and
in response to the change being performed to a repetition object in the model, propagating the change to affected repetition objects.

7. The computer implemented method of claim 1, further comprising outputting the at least one repetition instance via a user interface.

8. The computer implemented method of claim 1, wherein the one or more geometry guide surfaces are perpendicular to the steering curve.

9. The computer implemented method of claim 1, wherein the steering curve is a straight line.

10. A computer implemented method comprising:
running in a computer a modelling application that uses object instances to model one or more real world articles;
receiving, as a user input or as part of a model when the model is loaded, definitions defining at least one repetition object, a repetition object being one unit for creating one or more repetition instances to model a corresponding amount of occurrences of a repetitive article that is a real world article that may occur more than once and in a repetitive manner in a real world structure, definitions for a repetition object comprising at least one finite surface definition that defines a geometry definition surface and its location in a model, and at least one steering curve on a plane defined by the geometry definition surface, definitions for a steering curve defining at least spacing information between repetition points and an angle for geometry guide curves;
creating the at least one steering curve;
determining on the at least one steering curve one or more repetition points using at least the spacing information; and
creating one or more repetition instances of the at least one repetitive article by creating a repetition instance based on a curve segment that extends at the angle to the steering curve from a repetition point to outlines of the geometry definition surface so that the curve segment is not aligned with the guideline.

11. A computer implemented method, comprising:
providing a modeling application with at least one repetition object type for creating to a model at least one repetition instance of at least one repetitive article that is a real world article that may occur more than once and in a repetitive manner in a real world structure, wherein the repetition object type is provided to be used for creating one or more repetition objects, a repetition object being one unit for creating one or more repetition instances to model a corresponding amount of occurrences of the repetitive article and comprising definitions for at least one geometry definition surface, a geometry definition surface defining a finite surface and its location in the model, and at least one steering curve, definitions for a steering curve defining at least information based on which one or more geometry guide surfaces or geometry guide curves may be created at an angle to the steering curve in a three dimensional space, wherein a repetition instance of a repetitive article is determined using of an intersection of the at least one geometry definition surface and either a geometry guide surface or a geometry guide curve.

12. The computer implemented method of claim 11, wherein the steering curve definitions comprises at least property information describing at least cross section geometry of the at least one repetitive article to be used for outlines of the one or more repetition instances.

13. The computer implemented method of claim 11, further comprising:
providing the modeling application with at least one actual object type for creating at least one actual object representing at least one real world article in a model, wherein the actual object type is provided to be used for creating one or more actual objects, an actual object modeling one occurrence of the real world article and comprising definitions defining at least the actual object's location in a model and the actual object's geometry including cross section and length.

14. The computer implemented method of claim 11, further comprising:
providing the modeling application with a module for creating from the at least one repetition instance of at least one of the one or more repetition objects as many actual objects as there are repetition instances created based on the at least one or the one or more repetition objects.

15. An apparatus comprising at least one processor and at least one memory including a computer program code, the at least one memory and the computer program code configured to, with the at least one processor, cause, in response to receiving, as a user input or as part of a model when the model is loaded, definitions defining at least one repetition object, a repetition object being one unit for creating one or more repetition instances to model a corresponding amount of occurrences of a repetitive article that is a real world article that may occur more than once and in a repetitive manner in a real world structure, definitions for a repetition object comprising at least one finite surface definition that defines a geometry definition surface and its location in a model, and at least one steering curve, definitions for a steering curve defining at least information on starting and ending of the steering curve and information based on which one or more repetition points may be created, the apparatus at least to:
create the at least one steering curve;
determine on the at least one steering curve one or more repetition points;
create one or more geometry guide surfaces, a geometry guide surface being created on a repetition point with an angle in a three dimensional space to the steering curve so that the geometry guide surface is not aligned with the steering curve; and
create one or more repetition instances of the at least one repetitive article by creating a repetition instance based on an intersection of the at least one geometry definition surface and one of the one or more geometry guide surfaces created.

16. The apparatus of claim 15, wherein the at least one memory and the computer program code configured to, with the at least one processor, further cause, in response to receiving definitions defining one or more actual objects, definitions for an actual object defining at least the object's location in the model and the object's geometry, the actual object modeling one occurrence of one real world article, the apparatus to:
check whether at least one of the one or more actual objects matches with the geometry definition surface; and
if a match is found, associate the geometry definition surface with the at least one of the one or more actual objects.

17. The apparatus of claim 15, wherein the at least one memory and the computer program code configured to, with the at least one processor, further cause the apparatus to:
detect a change in the model;
in response to the change being performed to at least one actual object in the model, propagate the change to affected actual objects and repetition objects, an actual object modeling one occurrence of one real world article; and
in response to the change being performed to a repetition object in the model, propagate the change to affected repetition objects.

18. An apparatus comprising at least one processor and at least one memory including a computer program code, the at least one memory and the computer program code configured to, with the at least one processor, cause, in response to receiving, as a user input or as part of a model when the model is loaded, definitions defining at least one repetition object, a repetition object being one unit for creating one or more repetition instances to model a corresponding amount of occurrences of a repetitive article that is a real world article that may occur more than once and in a repetitive manner in a real world structure, definitions for a repetition object comprising at least one finite surface definition that defines a geometry definition surface and its location in a model, and at least one steering curve on a plane defined by the geometry definition surface, definitions for a steering curve defining at least spacing information between repetition points and an angle for geometry guide curves, the apparatus at least to:
create the at least one steering curve;
determine on the at least one steering curve one or more repetition points using at least the spacing information; and
create one or more repetition instances of the at least one repetitive article by creating a repetition instance based on a curve segment that extends at the angle to the steering curve from a repetition point to outlines of the geometry definition surface so that the curve segment is not aligned with the guideline.

19. A non-transitory computer readable media having stored thereon instructions that, when executed by an apparatus, cause the apparatus to:
provide a modeling application with at least one repetition object type for creating to a model at least one repetition instance of at least one repetitive article that is a real world article that may occur more than once and in a repetitive manner in a real world structure, wherein the repetition object type is provided to be used for creating one or more repetition objects, a repetition object being one unit for creating one or more repetition instances to model a corresponding amount of occurrences of the repetitive article and comprising definitions for at least one geometry definition surface, a geometry definition surface defining a finite surface and its location in the model, and at least one steering curve, definitions for a steering curve defining at least information based on which one or more geometry guide surfaces or geometry guide curves may be created at an angle to the steering curve in a three dimensional space, wherein a repetition instance of a repetitive article is determined using of an intersection of the at least one geometry definition surface and either a geometry guide surface or a geometry guide curve.

20. The non-transitory computer readable media of claim 19, having stored thereon further instructions, when executed by the apparatus, further cause the apparatus to:

create from the at least one repetition instance of at least one of the one or more repetition objects as many actual objects as there are repetition instances created based on the at least one or the one or more repetition objects; and output the repetition instances as actual objects.

* * * * *